US011189508B2

(12) United States Patent
Hu et al.

(10) Patent No.: US 11,189,508 B2
(45) Date of Patent: Nov. 30, 2021

(54) PURGED VIEWPORT FOR QUARTZ DOME IN EPITAXY REACTOR

(71) Applicant: Applied Materials, Inc., Santa Clara, CA (US)

(72) Inventors: Ji-Dih Hu, San Jose, CA (US); Brian H. Burrows, San Jose, CA (US); Janardhan Devrajan, Santa Clara, CA (US); Schubert Chu, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/581,029

(22) Filed: Sep. 24, 2019

(65) Prior Publication Data

US 2020/0105554 A1  Apr. 2, 2020

Related U.S. Application Data

(60) Provisional application No. 62/739,615, filed on Oct. 1, 2018.

(51) Int. Cl.
*H01L 21/67* (2006.01)
*C23C 16/44* (2006.01)
(Continued)

(52) U.S. Cl.
CPC .... *H01L 21/67248* (2013.01); *C23C 16/4408* (2013.01); *C30B 25/08* (2013.01); *G01J 5/0007* (2013.01); *H01L 21/67115* (2013.01); *H05B 3/0047* (2013.01); *G01J 5/02* (2013.01); *G01J 5/08* (2013.01); *G01K 11/12* (2013.01)

(58) Field of Classification Search
None
See application file for complete search history.

(56) References Cited

U.S. PATENT DOCUMENTS

2003/0124820 A1*  7/2003  Johnsgard ......... H01L 21/67017
                                                118/715
2009/0194024 A1*  8/2009  Burrows ............... C23C 16/452
                                                118/712

(Continued)

FOREIGN PATENT DOCUMENTS

JP    2004031398 A      1/2004
JP    2008277673 A     11/2008
JP    2008277673 A  *  11/2008

OTHER PUBLICATIONS

PCT/US2019/052740, International Search Report and Written Opinion dated Jan. 13, 2020, 14 pages.

*Primary Examiner* — Binu Thomas
(74) *Attorney, Agent, or Firm* — Patterson + Sheridan, LLP

(57) ABSTRACT

Embodiments described herein generally relate to an in-situ metrology system that can constantly provide an uninterrupted optical access to a substrate disposed within a process chamber. In one embodiment, a metrology system for a substrate processing chamber is provided. The metrology system includes a sensor view pipe coupling to a quartz dome of a substrate processing chamber, a flange extending radially from an outer surface of the sensor view pipe, and a viewport window disposed on the flange, the viewport window having spectral ranges chosen for an optical sensor that is disposed on or adjacent to the viewport window.

15 Claims, 8 Drawing Sheets

(51) Int. Cl.
    *C30B 25/08* (2006.01)
    *G01J 5/00* (2006.01)
    *H05B 3/00* (2006.01)
    *G01K 11/12* (2021.01)
    *G01J 5/02* (2006.01)
    *G01J 5/08* (2006.01)

(56) References Cited

U.S. PATENT DOCUMENTS

| | | |
|---|---|---|
| 2011/0159183 A1 | 6/2011 | Jin |
| 2013/0343425 A1* | 12/2013 | Tas .................... C23C 16/44 374/121 |
| 2013/0343426 A1 | 12/2013 | Gurary et al. |
| 2016/0125589 A1* | 5/2016 | Tertitski ............ H01L 21/67259 382/151 |
| 2017/0082537 A1* | 3/2017 | Ido ..................... G01N 21/8507 |
| 2018/0066382 A1* | 3/2018 | Brillhart ........... H01L 21/67115 |

* cited by examiner

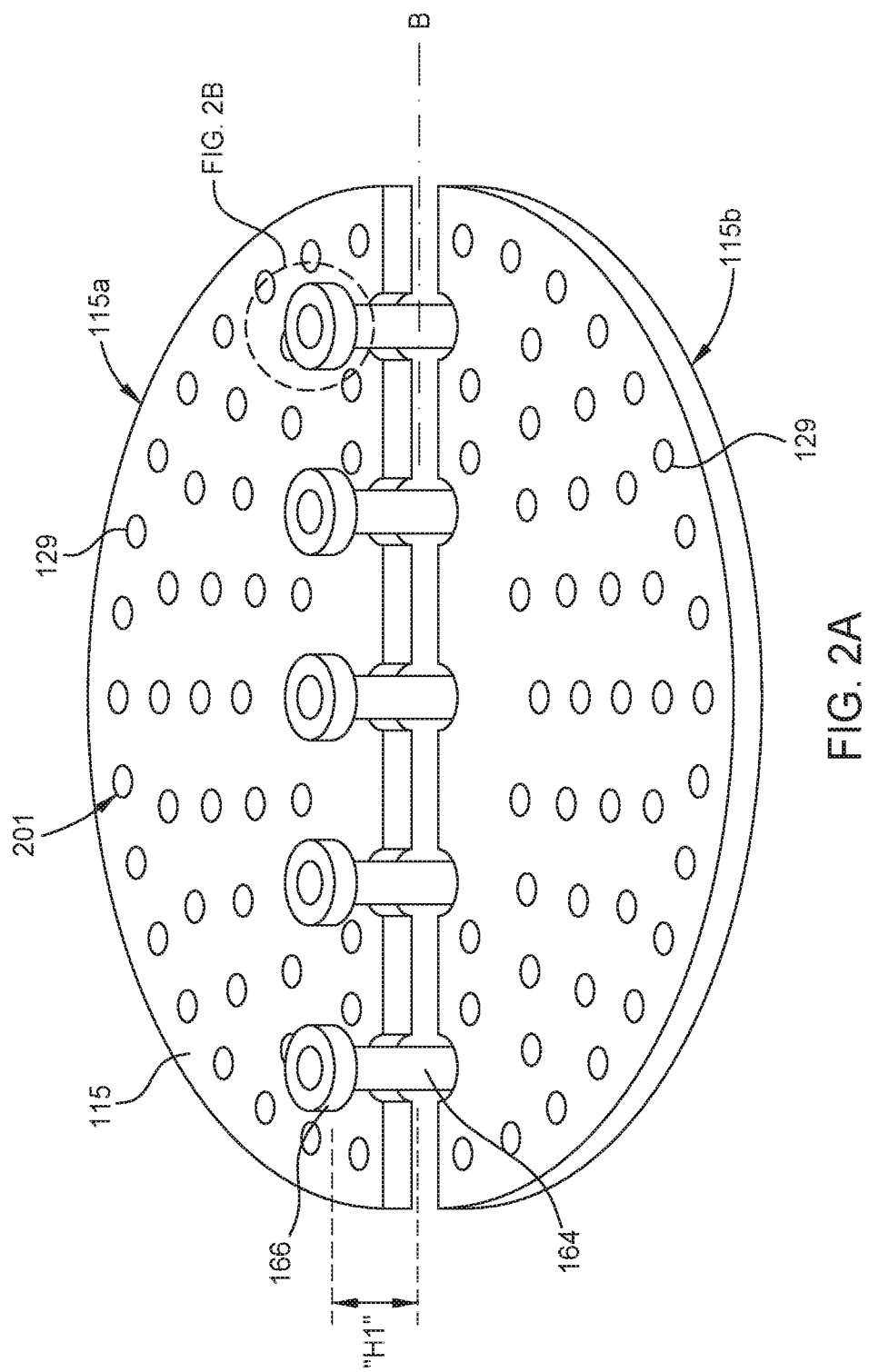

PURGED VIEWPORT FOR QUARTZ DOME IN EPITAXY REACTOR

CROSS-REFERENCE TO RELATED APPLICATIONS

This application claims benefit of U.S. provisional patent application Ser. No. 62/739,615, filed Oct. 1, 2018, which is herein incorporated by reference.

BACKGROUND

Field

Embodiments disclosed herein generally relate to the field of semiconductor manufacturing equipment, and more specifically, an in-situ metrology system for a thermal processing chamber.

Description of the Related Art

Semiconductor processing equipment is used in the deposition, patterning, and treatment of thin films and coatings. A conventional substrate processing chamber provides a pedestal or some equivalent way of supporting the substrate for processing. High temperature processes often use quartz domes and external lamps to quickly raise the temperature of the substrate to a processing temperature. Traditional methods of determining temperature/emissivity involve aiming a pyrometer through a top quartz dome at the substrate. It has been observed that the top quartz dome can become cloudy due to a heavy parasitic deposition from the process inside the processing chamber, which can cause the pyrometer to lose optical access partially or even completely. As a result, the measurement is compromised.

Therefore, there is a need in the art to provide an apparatus that can constantly provide a clear optical access for an in-situ metrology system.

SUMMARY

Embodiments described herein generally relate to an in-situ metrology system that can constantly provide an uninterrupted optical access to a substrate disposed within a process chamber. In one embodiment, a metrology system for a substrate processing chamber is provided. The metrology system includes a sensor view pipes coupling to a quartz dome of a substrate processing chamber, a flange extending radially from an outer surface of the sensor view pipes, and a viewport window disposed on the flange, the viewport window having spectral ranges chosen for an optical sensor that is disposed on or adjacent to the viewport window.

In another embodiment, an apparatus is provided. The apparatus includes a quartz chamber defining a process volume therein, a substrate support disposed within the process volume, and a sensor view pipe extending between the quartz chamber and an optical sensor.

In yet another embodiment, a substrate processing chamber is provided. The substrate processing chamber includes an upper dome, a lower dome opposing the upper dome, a sidewall disposed between the upper dome and the lower dome, wherein the upper dome, the lower dome and the sidewall defines a process volume therein, a substrate support disposed in the process volume, a sensor view pipe extending between an optical sensor and the upper dome, a viewport window disposed over the sensor view pipe, the viewport window having spectral ranges chosen for the optical sensor that is disposed on or adjacent to the viewport window, and a radiation source disposed below the lower dome.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 2A is a perspective top view of a portion of a reflector plate according to one embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein generally relate to an in-situ metrology system that can constantly provide an uninterrupted optical access to a substrate disposed within a process chamber. Openings are made to a top quartz dome of the process chamber at locations where optical access is needed. A sensor view pipe is extended upwardly from the openings to an optical sensor that is disposed over a cover plate of the process chamber. The upper end of the sensor view pipe is coupled to a flange. A viewport window with spectral ranges chosen for the optical sensor is disposed between the flange and the optical sensor. As the viewport window is raised up and away from the hot processing chamber, the window can remain at a temperature lower than the decomposition temperatures of the precursors flowing in the process chamber. As a result, the parasitic deposition of the precursors on the viewport window is reduced. Other approaches may also be used to enhance optical accessibility of the in-situ metrology system.

Figure 1:
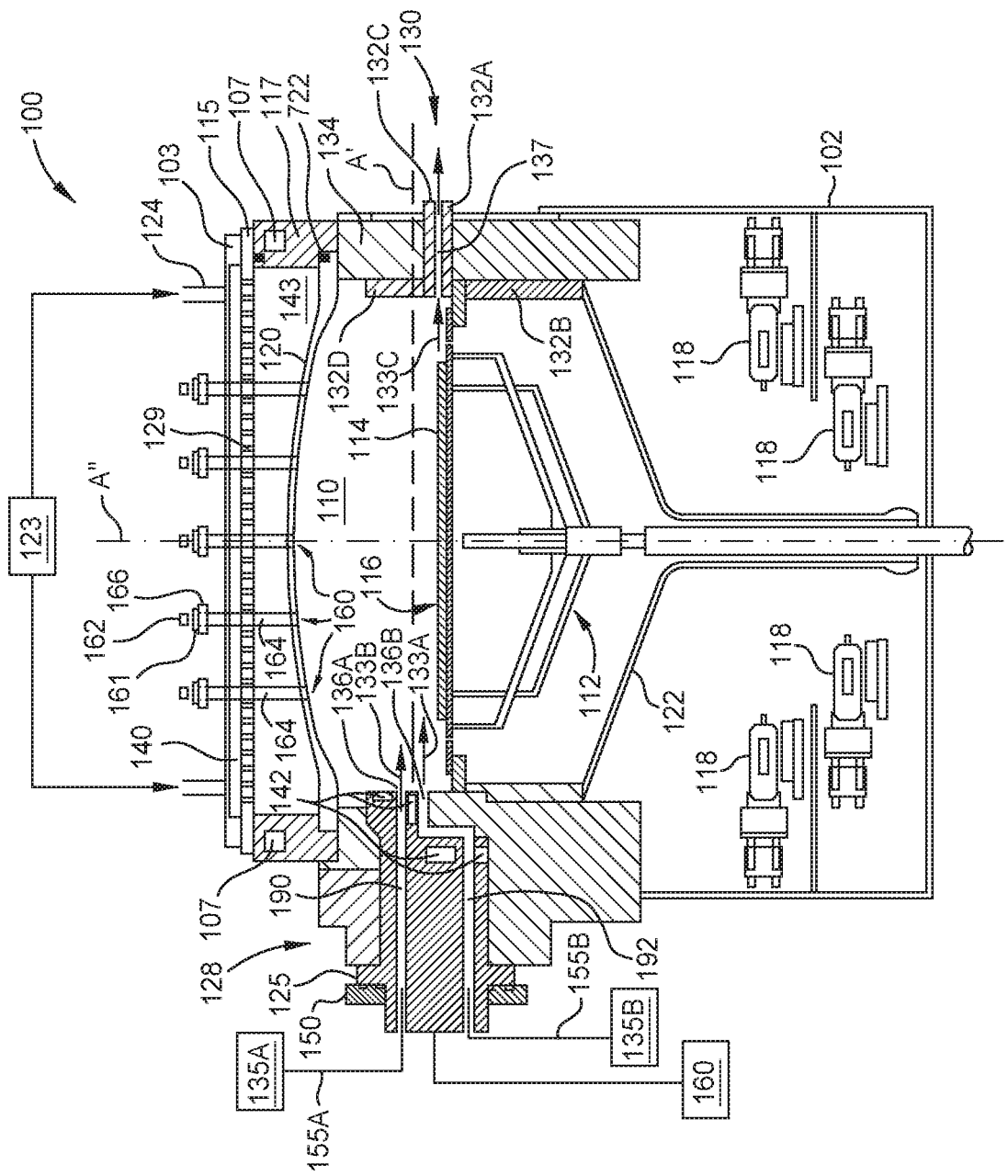
FIG. 1 is a schematic side cross-sectional view of a process chamber according to an embodiment of the present disclosure.

FIG. 1 is a schematic side cross-sectional view of a process chamber 100 according to an embodiment of the present disclosure. The process chamber 100 may be utilized for performing chemical vapor deposition, such as epitaxial deposition processes, although the process chamber 100 may be utilized for etching or other processes. Non-limiting examples of the process chamber 100 include the CENTURA® RP EPI reactor, which is commercially available from Applied Materials, Inc. of Santa Clara, Calif. While the process chamber 100 described herein may be utilized to practice various embodiments described herein, other suitably configured process chambers from different manufacturers may also be used to practice the embodiments described in this disclosure.

The process chamber 100 includes a housing structure 102 fabricated from a process resistant material, such as aluminum or stainless steel. The housing structure 102 encloses various functioning elements of the process chamber 100, such as a quartz chamber, which includes an upper dome 120, a lower dome 122, and a sidewall 134 disposed between the upper dome 120 and the lower dome 122. The upper dome 120, the lower dome 122, and the sidewall 134 define a process volume 110 therein. A substrate support 112 is disposed within the process volume 110 and adapted to receive a substrate 114.

Reactive species derived from one or more precursors are exposed to a process surface 116 of the substrate 114 to perform a deposition process. The deposition process may be a GaN or AlGaN epitaxy growth on a substrate, such as a silicon wafer. Byproducts from deposition processes and the reactive species exposure are subsequently removed from the process surface 116. Heating of the substrate 114 and/or the process volume 110 is performed by one or more radiation sources, such as lamp modules 118. The upper dome 120 and the lower dome 122 are fabricated from a quartz containing material which is substantially transparent to a wavelength of the radiation emitted from the lamp modules 118. In one embodiment, the lamp modules 118 are positioned below the lower dome 122. If desired, the lamp modules 118 may also be positioned above the upper dome 120.

Reactive species are delivered to the process chamber 100 by a gas injector apparatus 128. In one embodiment, the injector apparatus 128 is a unitary body with one or more conduits and channels formed therein. Processing byproducts are removed from the process volume 110 by an exhaust assembly 130 which is in fluid communication with a vacuum source (not shown). Precursor reactant materials and other gases such as diluent, purge, and vent gases enter the process volume 110 through the gas injector apparatus 128 and exit the process volume 110 through the exhaust assembly 130.

The process chamber 100 also includes multiple liners 132A-132D which shield the sidewall 134 from the process volume 110. The injector apparatus 128 includes an injector body 125 with a plurality of conduits, such as a first conduit 190, a second conduit 192, formed therein. One or more precursor gases are provided to the process volume 110 from a first gas source 135A and a second gas source 135B through the first conduit 190 and the second conduit 192, respectively. For example, the first gas source 135A provides a first gas to the process volume 110 via the first conduit 190 formed in the injector body 125 and the second gas source 135B provides a second gas to the process volume 110 through the second conduit 192 formed in the injector body 125. The first conduit 190 and the second conduit 192 keep the first and second gases separated until the gases reach the process volume 110.

Gas from both the first gas source 135A and the second gas source 135B travels through the one or more outlets 136A and 136B formed in the injector body 125. In one embodiment, gas provided from the first gas source 135A travels through the outlet 136A and gas provided from the second gas source 135B travels through the outlet 136B. A coolant fluid is provided to the gas injector apparatus 128 via a coolant source 160. The coolant fluid is flowed through a channel 142 formed in the injector body 125.

The one or more outlets 136A and 136B formed in the injector body 125 are coupled to outlets configured for a laminar flow path 133A or a jetted flow path 133B. The outlets 136A and 136B are configured to provide individual or multiple gas flows with varied parameters, such as velocity, density, or composition. In one embodiment where multiple outlets 136A and 136B are adapted, the outlets 136A and 136B are distributed along a portion of the gas injector apparatus 128 (e.g., injector body 125) in a substantially linear arrangement to provide a gas flow that is wide enough to substantially cover the diameter of the substrate 114. For example, each of the outlets 136A and 136B are arranged in at least one linear group to provide a gas flow generally corresponding to the diameter of the substrate. Alternatively, the outlets 136A and 136B are arranged in substantially the same plane or level for flowing the gas(es) in a planar, laminar fashion.

Each of the flow paths 133A, 133B is configured to flow across a longitudinal axis A" of the process chamber 100 in a laminar or non-laminar flow fashion to the exhaust liner 132D. The flow paths 133A, 133B are generally coplanar with the axis A' or may be angled relative to the axis A'. For example, the flow paths 133A, 133B may be angled upward or downward relative to the axis A'. The axis A' is substantially normal to the longitudinal axis A" of the process chamber 100. The flow paths 133A, 133B culminate in an exhaust flow path 133C and flow into a plenum 137 formed in the exhaust liner 132A, 132C. The plenum 137 is coupled to an exhaust or vacuum pump (not shown).

A reflector plate 115 is disposed over the upper dome 120 between a cover plate 103 of the housing structure 102 and the upper dome 120. The reflector plate 115 is configured to reflect radiation emitted from the substrate 114, back onto the substrate 114. The reflector plate 115 can be made of a metal such as aluminum or stainless steel. The efficiency of the reflection can be improved by coating a reflector area with a highly reflective coating such as gold.

The reflector plate 115 may be secured to a clamp ring 117 disposed over the edge of the upper dome 120. The clamp ring 117 may have a cooling conduit 107 configured to circulate a cooling fluid, such as water, through and around the clamp ring 117. The cover plate 103 may be secured to the reflector plate 115. As will be discussed later in more detail, the cover plate 103 and the reflector plate 115 may have a split design that can be quickly separated/combined and aligned with the upper dome 120 via a clocking feature during the installation.

The reflector plate 115 includes a plurality of perforations 129 formed therethrough. A pressurized fluid source 123 contains a pressurized fluid, such as air, and is in fluid communication with a first volume 140 between the cover plate 103 and the reflector plate 115 via a plurality of inlet ports 124. The pressurized fluid source 123 is also in fluid communication with a second volume 143 between the reflector plate 115 and the upper dome 120. The pressurized fluid is flowed against a surface of the upper dome 120 facing the cover plate 103 through the plurality of perforations 129 of the reflector plate 115.

The pressurized fluid impinges the surface of the upper dome 120 to cool the upper dome 120 during the process. The cooling of the upper dome 120 prevents deposition of materials on a side of the upper dome 120 facing the process volume 110. The prevention of deposition onto the first quartz window 120 maintains transparency thereof and prevents buildup of deposition materials thereon. The pressurized fluid exits the volume between the upper dome 120 and the cover plate 103 through one or more exhaust ports (not shown).

In-Situ Metrology System

The interior of the process chamber and/or the substrate may be optically monitored by spectrally analyzing wavelengths of light emitted or reflected from the substrate or a target in the process chamber. An optical sensor is often positioned on the exterior of the process chamber and adjacent to a viewport window, with a vantage point to the substrate or the target in the process chamber to be monitored. One problem with optical monitoring processes in the process chamber is that the reactive gases, polymer, or species can be deposited on the interior surfaces of the process chamber, such as the upper dome and the viewport window. The upper dome can get heavy parasitic deposition and become cloudy, which affects the measurements of the optical sensor. While the entire interior surface of the process chamber, including the upper dome, is cleaned or replaced from time to time, the optical sensor needs to be recalibrated and the process chamber needs to be recertified, which is time consuming and expensive. Embodiments of the present disclosure provide an improved in-situ metrology system that can reduce or eliminate the effects of parasitic deposition on a viewport window in a reactive environment. Various approaches are discussed in more detail below.

In one embodiment, the in-situ metrology system includes a sensor view pipe 164 coupling to the upper dome 120. The upper dome 120 has one or more openings 160 formed through the thickness of the upper dome 120. The sensor view pipes 164 are coupled to the openings 160 and extended upwardly from the openings 160 through the perforations 129 of the reflector plate 115 and to the cover plate 103. The sensor view pipes 164 are generally extended along a longitudinal axis A" of the process chamber 100. The lower end of each sensor view pipe 164 is welded and sealed around the corresponding opening 160. The upper end of each sensor view pipe 164 has a flange 166 extended radially from the outer surface of the sensor view pipe 164. The flange 166 can be a ring shape having an inner diameter identical to, or slightly smaller than the outer diameter of the sensor view pipe 164. The flange 166 may be welded to the upper end of the sensor view pipe 164. The bottom surface of the flange 166 may be in physical contact with the upper surface 105 of the cover plate 103. The flange 166 may be a quartz or any material suitable for holding a viewport window to be discussed below. The flange 166 may have an overall thickness of about 8 mm to about 16 mm, for example about 12 mm. The sensor view pipe 164 may be a sapphire or quartz tube around 8 mm to about 15 mm in diameter. The tube wall of the sensor view pipe 164 may have a thickness of about 1 mm to about 5 mm.

A viewport window 161 is disposed above and supported by the flange 166. The viewport window 161 has spectral ranges chosen for an optical sensor 162 that is disposed over the viewport window 161. The optical sensor 162 may be separated from the viewport window 161 by a gap. In one example, the optical sensor 162 is supported by a bracket (not shown) mounting to the cover plate 103. In some cases, the optical sensor is positioned on the exterior of the process chamber 100 and adjacent to the viewport window 161, with a vantage point to the target area in the process chamber to be observed. The optical sensors 162 may be any sensor that is capable of measuring temperature of the substrate, curvature of the substrate, reflectance from the substrate, or any combination thereof. The openings 160 are arranged at locations corresponding to the locations of the optical sensors 162. The optical sensors 162 may be configured in a linear arrangement at different substrate radii or any desired arrangement to monitor characteristics of the substrate at locations of interest to an operator. While five openings 160 are shown, more or less openings 160 are contemplated depending upon the number of the optical sensors 162 desired for the application.

The sensor view pipes 164 and the openings 160 allow one or more focal beams from the optical sensors 162 to pass through and into the process volume 110. Since the viewport window 161 is raised up from the hot processing chamber by the long sensor view pipes 164, the viewport window 161 can remain at a very low temperature (e.g., room temperature) that is below the decomposition temperatures of the precursors. Therefore, the reactive precursors or species do not develop parasitic deposition on the viewport window 161. The long sensor view pipes 164 can ensure the viewport window 161 to stay clear and provide a constant, uninterrupted optical access to the substrate 114 disposed within the process chamber 100.

FIG. 2A is a perspective top view of a portion of the reflector plate 115 according to one embodiment. The cover plate 103 is omitted for ease of illustration. In this embodiment, the perforations 129 are linearly arranged along a straight line in a row across the reflector plate 115. The reflector plate 115 is a split design that can be separated into two halves 115a, 115b along a split line "B". The split line "B" is a straight line formed between the two halves 115a, 115b where end surfaces thereof meet in opposed relation. FIG. 2A further shows a stage prior to assembly of two halves 115a, 115b. When two halves 115a, 115b assembled, the split line "B" traverse over the center of the perforations 129. In some embodiments, ventilation holes 201 are provided to allow for air flow to provide cooling to the second volume 143.

The upper end of the sensor view pipes 164 is extended through the perforations 129 of the reflector plate 115 to a height "H1" over the reflector plate 115. The height "H1" is defined by a distance between a top surface of the reflector plate 115 and a bottom surface of the flange 166. The height "H1" may be in a range of about 5 inches to about 40 inches, for example about 25 inches to about 35 inches. The viewport window 161 and the optical sensor 162 have been omitted for ease of illustration. As can be seen, the perforations 129 for the sensor view pipes 164 have an inner diameter larger than the outer diameter of the sensor view pipes 164. Particularly, each perforation 129 provides a clearance between an inner surface of the perforations 129 and an outer surface of the sensor view pipes 164. The clearance may be in a range of about 1 mm to about 3 mm, for example.

Figure 2B:
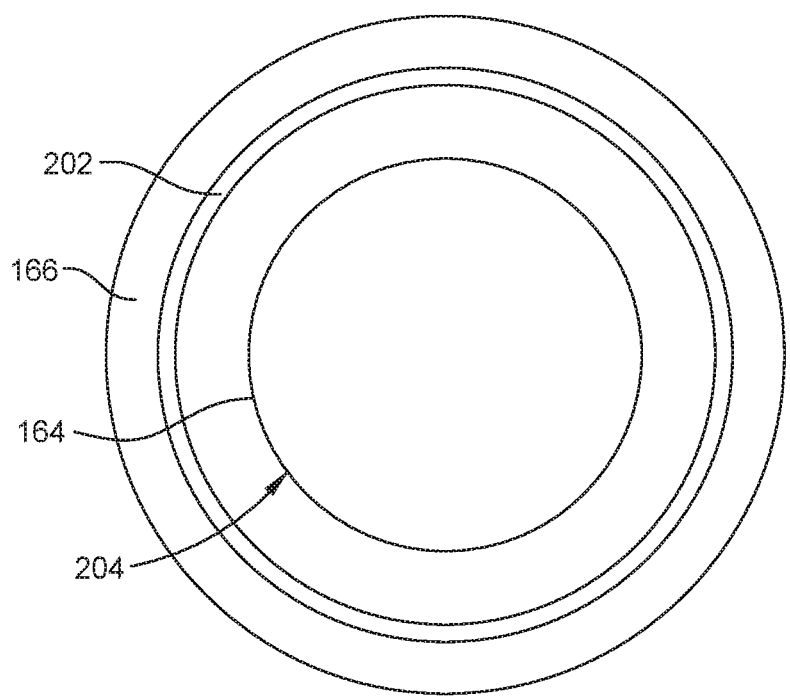
FIG. 2B is an enlarged top view of the flange 166 shown in FIG. 2A according to one embodiment

FIG. 2B is an enlarged top view of the flange 166 shown in FIG. 2A according to one embodiment. The flange 166 is extended radially from an outer surface 204 of the sensor view pipe 164. The upper surface of the flange 166 has a groove 202 sized to receive a sealing member, such as an O-ring. Once the O-ring is placed within the groove 202, a viewport window (not shown, such as the viewport window 161 shown in FIG. 1) is mounted against the flange 166 to provide a hermetical seal between the flange 166 and the viewport window.

While the lower temperature of viewport window 161 does not promote cracking of the precursor gas, the viewport window 161 may still invite gas phase reaction product to adsorb onto the surface of the viewport window 161. In order to suppress the adsorption, a purge gas can be introduced into the sensor view pipe 164 to prevent or minimize gas phase reaction product from adsorbing onto the surface of the viewport window 161, which is exposed to the interior of the process chamber 100. Suitable purge gas may include nitrogen, helium, argon, any inert gas or non-reactive gas.

Figure 3:
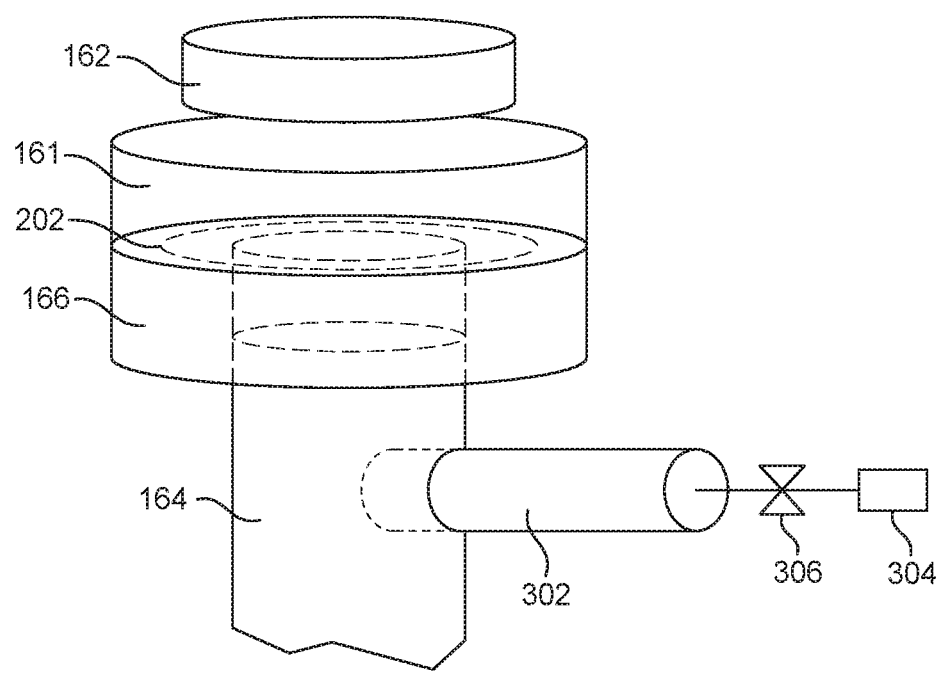
FIG. 3 illustrates a perspective view of a portion of the in-situ metrology system according to one embodiment of the present disclosure.

FIG. 3 illustrates a perspective view of a portion of the in-situ metrology system according to one embodiment of the present disclosure. The in-situ metrology system has a set up substantial identical to the in-situ metrology system in terms of the optical sensor 162, the viewport window 161, the flange 166, the sensor view pipe 164, and the groove 202. A purge gas tube 302 is further provided to the sensor view pipe 164 to introduce the purge gas into the sensor view pipe 164. The purge gas tube 302 has a first end in fluid communication with a purge gas source 304, and a second end connected to a side of the sensor view pipe 164. A mass flow controller 306 is disposed between the purge gas source 304 and the purge gas tube 302 to control the flow of the purge gas. The partial pressure of the purge gas is controlled in a range so that the flow of the purge gas is just sufficient for viewport window protection but not high enough to interfere with the cross flow of the precursor gases and/or deposition process in the process chamber 100. In an example embodiment, the partial pressure of the purge gas is about 0.5% to about 10% higher, for example about 1% to about 5% higher than the chamber pressure. The chamber pressure may be in a range from about 0.001 Torr to about 1000 Torr, such as about 0.1 Torr to about 400 Torr, for example about 20 Torr to about 150 Torr. However, it is contemplated that partial pressure of the purge gas may vary depending on the process and the chamber pressure maintained in the process chamber.

Figure 4:
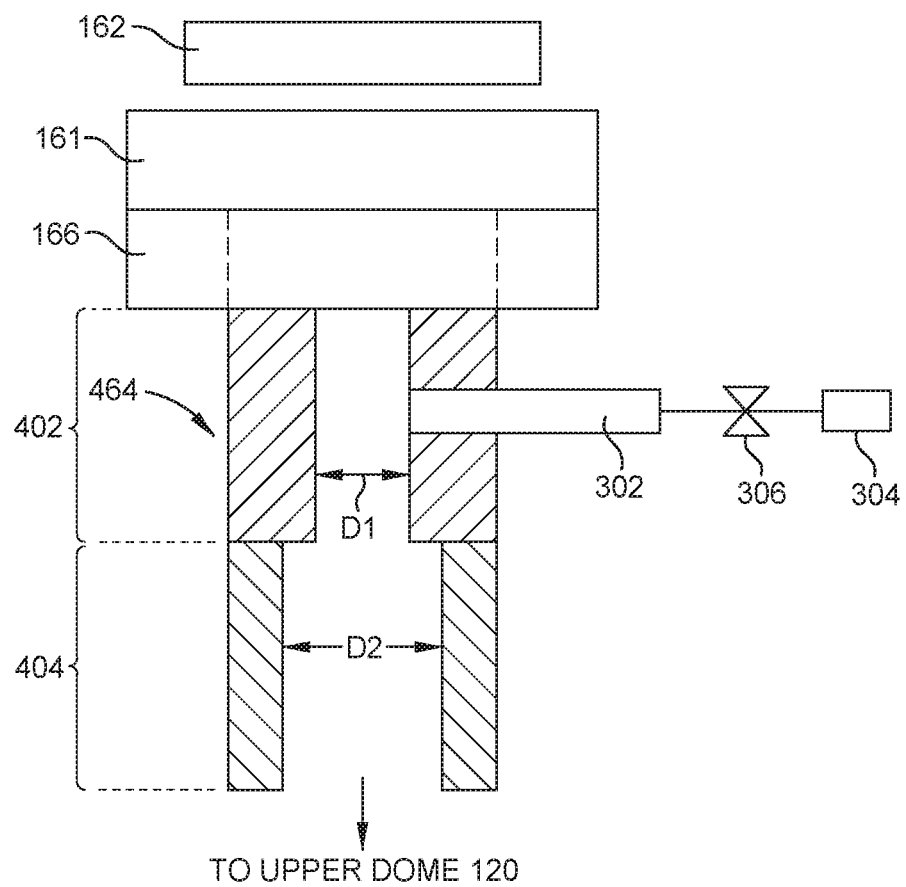
FIG. 4 illustrates a cross-sectional view of a portion of the in-situ metrology system according to one embodiment of the present disclosure.

In some embodiments, the sensor view pipe 164 can have different inner diameters to further minimize the impact of the purging gas flow to the process within the process chamber 100. FIG. 4 illustrates a cross-sectional view of a portion of the in-situ metrology system according to one embodiment of the present disclosure. In this embodiment, the sensor view pipe 464 is comprised of an upper section 402 and a lower section 404 with different inner diameters. The purge gas tube 302 is coupled to the upper section 402 of the sensor view pipe 464. The upper section 402 and the lower section 404 may be formed as an integral body or two sensor view pipes welded together. The sensor view pipe 464 has a uniform outer diameter along the longitudinal axis of the sensor view pipe 464. The upper section 402 has a first inner diameter D1 and the lower section 404 has a second inner diameter D2 that is larger than the first inner diameter D1. The first inner diameter D1 is designed by considering the minimum optical path width requirement of the optical sensor 162 assigned to the viewport window 161. The larger, second inner diameter D2 allows the flow of the purge gas from the purge gas tube 302 to slow down before reaching the opening (e.g., openings 160 shown in FIG. 1) as it gets expanded radially when flowing from the upper section 402 to the lower section 404. As a result, the impact of the purging flow to the precursor gas flow in the process chamber 100 is reduced. In one embodiment, the first inner diameter D1 to the second inner diameter D2 is at a ratio of about 1:1.1 to about 1:3, for example about 1:1.5 to about 1:2.

Figure 5:
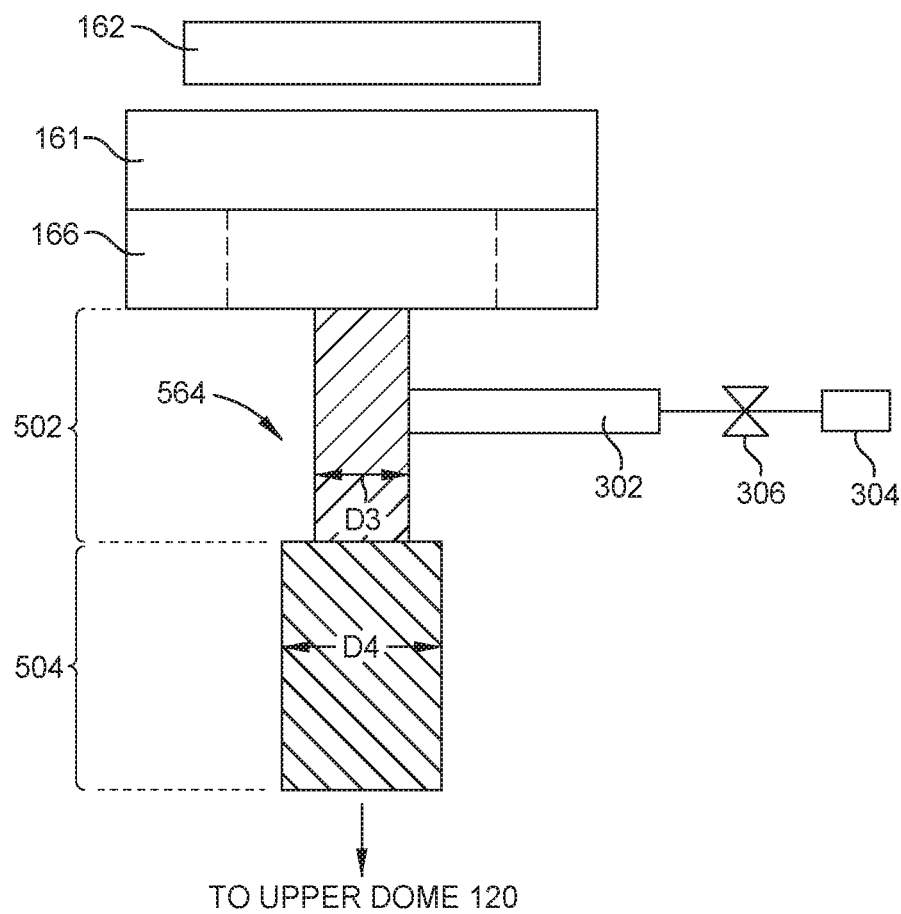
FIG. 5 illustrates a cross-sectional view of a portion of the in-situ metrology system according to another embodiment of the present disclosure.

FIG. 5 illustrates a cross-sectional view of a portion of the in-situ metrology system according to another embodiment of the present disclosure. In this embodiment, the sensor view pipe 564 is comprised of an upper section 502 and a lower section 504 with different inner diameters and outer diameters along the longitudinal axis of the sensor view pipe 564. The upper section 402 and the lower section 504 may be formed as an integral body or two sensor view pipes welded together. The upper section 502 has a first inner diameter D3 and the lower section 504 has a second inner diameter D4 that is larger than the first inner diameter D3. Likewise, the larger, second inner diameter D4 allows the flow of the purge gas from the purge gas tube 302 to slow down before reaching the opening (e.g., openings 160 shown in FIG. 1) as it gets expanded radially when flowing from the upper section 502 to the lower section 504. As a result, the impact of the purging flow to the precursor gas flow in the process chamber 100 is reduced. In one embodiment, the first inner diameter D3 to the second inner diameter D4 is at a ratio of about 1:1.1 to about 1:3, for example about 1:1.5 to about 1:2.

Figure 6:
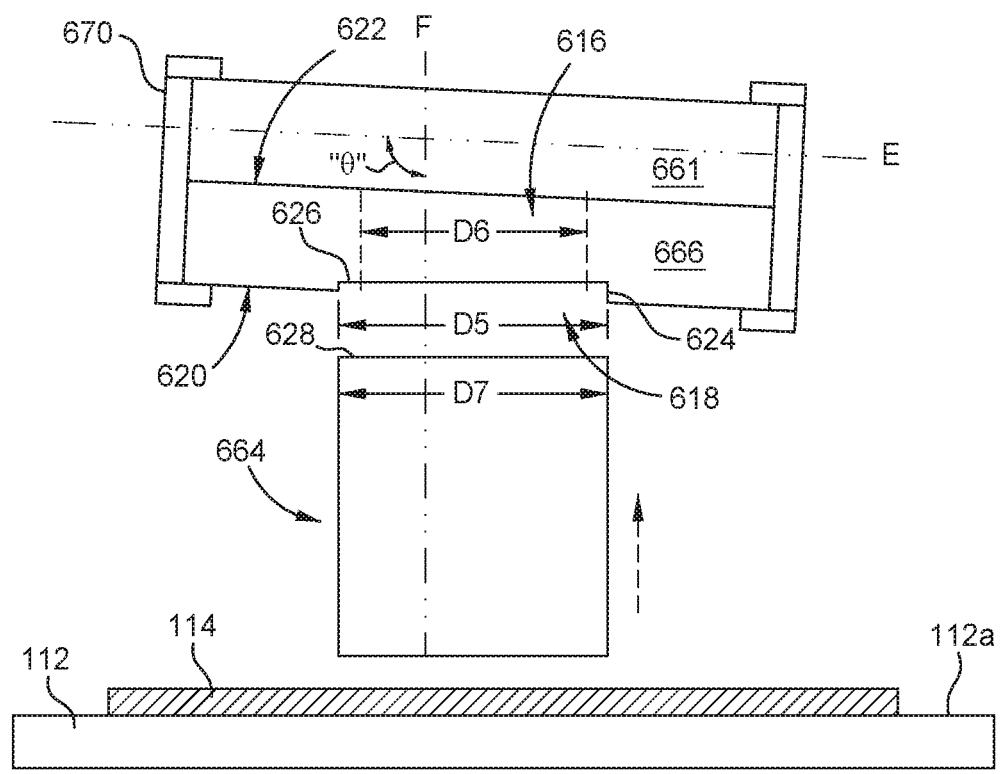
FIG. 6 illustrates a cross-sectional view of a portion of the in-situ metrology system showing a flange coupled to a sensor view pipe according to one embodiment.

FIG. 6 illustrates a cross-sectional view of a portion of the in-situ metrology system showing a flange 666 is coupled to a sensor view pipe 664 according to one embodiment. The flange 666 and the sensor view pipe 664 are similar or identical to the flange and the sensor view pipes discussed above with respect to FIGS. 1 to 5 except that a top surface 622 of the flange 666 is tilted or inclined with respect to a top surface 112a of the substrate support 112. The tilted or inclined top surface 622 may be obtained by forming a recess 618 in the bottom surface 620 of the flange 666. The recess 618 may be drilled at an angle into the bottom surface 620 so that the sidewall 624 of the recess 618 is tapering or gradually decreased towards one end of the flange 666. Therefore, the bottom surface 626 of the recess 618 is in a non-parallel relationship to the top surface 622 or the bottom surface 620 of the flange 666. The bottom surface 626 of the recess 618 and the top surface 628 of the sensor view pipe 664 are parallel to one another. The angle allows the sensor view pipe 664 to couple to the flange 666 at an angle, resulting in the flange 666 with a tilted or inclined top surface 622. The titled top surface 622 of the flange 666 allows a viewport window 661, such as any viewport window discussed above, to be placed thereon with an angle too. This angled arrangement can help the in-situ metrology system to receive majority of light reflected back from the substrate 114 while light reflection from the reflective viewport window 661 is re-directed to areas other than the optical sensor disposed on or adjacent to the viewport window 661. It has been observed that the noise caused by the light reflection from the viewport window 661 can be eliminated by purposely mounting the viewport window 661 at a small angular offset of a few degrees.

In one embodiment, the bottom surface 626 of the recess 618 is extending along a first direction and the bottom surface 620 of the flange 666 is extending along a second direction, and the angle between the first direction and the second direction is about 1° to about 10°, for example about 2° to about 7°. Alternatively, once the flange 666 is coupled to the sensor view pipe 664 and the viewport window 661 is disposed on the flange 666, the longitudinal axis "E" of the viewport window 661 is at an angle "θ" with respect to the longitudinal axis "F" of the sensor view pipe 664, and the angle "θ" can be between about 91° to about 100°, for example about 92° to about 97°.

The recess 618 has a diameter D5. The flange 666 has a central opening 616 and an inner diameter D6 of the central opening 616 is smaller than the diameter D5 of the recess 618. The sensor view pipe 664 has an outer diameter D7. The diameter D5 of the recess 618 may be identical to, or slightly smaller than the outer diameter D7 of the sensor view pipe 664. The sensor view pipe 664 may be coupled to the flange 666 using any suitable approach such as welding. A clamp 670 may be used to secure the viewport window 661 to the flange 666. The clamp 670 may be in the form of two semicircular rings and sized to surround the outer surfaces of the flange 666 and the viewport window 661. The two semicircular rings can be hinged together using a tightening nut or other suitable approach. The clamp 670 may be made of plastic material or any suitable material that does not harm the viewport window 661.

Figure 7:
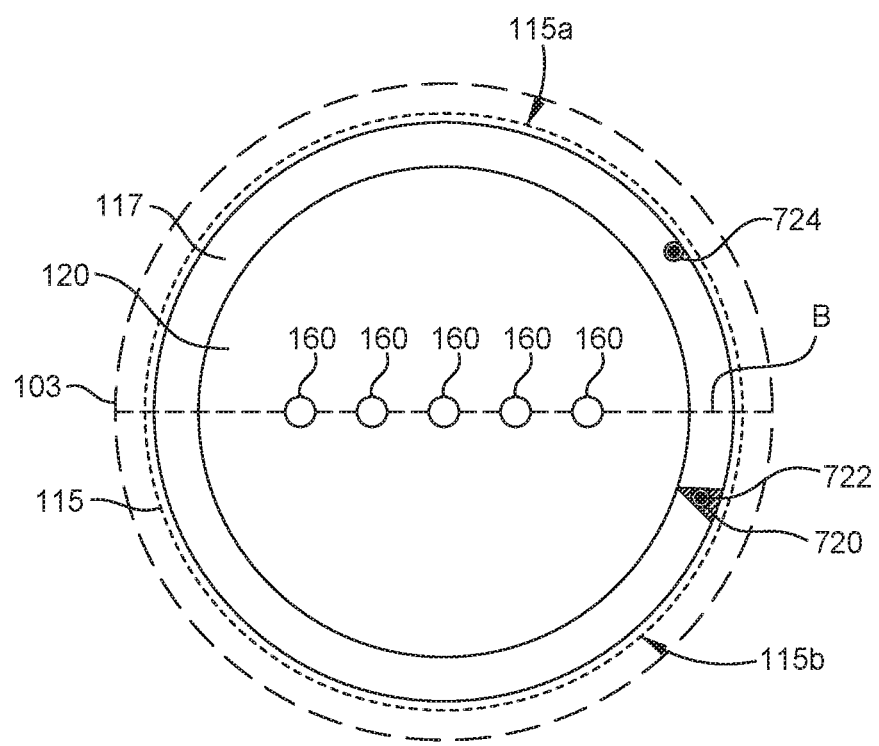
FIG. 7 illustrates a top view of a portion of the process chamber according to one embodiment.

FIG. 7 illustrates a top view of a portion of the process chamber 100 according to one embodiment. For ease of discussion purposes, only the upper dome 120, the clamp ring 117, the reflector plate 115 and the cover plate 103 are shown. The reflector plate 115 and the cover plate 103 are represented by dotted lines. The clamp ring 117 is disposed around and covering the edge of the upper dome 120. The clamp ring 117 and the upper dome 120 have a clocking feature to help accurate alignment of the clamp ring 117 to the upper dome 120. In one embodiment, a nipple or peg 722 is provided to a bottom of the clamp ring 117, for example, at the edge of the clamp ring 117. A corresponding notch 702 can be provided to the upper dome 120 at the edge of the upper dome 120. During the installation, the upper dome 120 is disposed on the sidewall (e.g., sidewall 134) of the process chamber 100. The clamp ring 117 is then mounted onto the sidewall using the nipple or peg 722 and the corresponding notch 702 to ensure that the clamp ring 117 is angularly orientated with the upper dome 120. The nipple or peg 722 and the corresponding notch 702 are positioned to ensure the openings 160 are aligned with the optical sensors (such as the optical sensors 162 shown in FIG. 1) disposed over the cover plate 103. A feature 724 similar to the nipple or peg 722 may be provided to the reflector plate 115 to ensure two halves 115a, 115b, when combined, have proper angular orientation with the upper dome 120 so that the split line "B" is passed through the center of the openings 160.

Various embodiments of this disclosure provide an in-situ metrology system that uses a sensor view pipe extending between an opening of a quartz dome and an optical sensor disposed over a cover plate of a process chamber. The sensor view pipe allows a viewport window to raise up and away from the hot processing chamber. A purge gas can also be introduced into the sensor view pipe to suppress the adsorption of precursor gas onto the viewport window. Therefore, the viewport window can remain at low temperatures and clean without developing parasitic deposition of precursors on the viewport window. As a result, a constant, uninterrupted optical access to the substrate is obtained.

While the foregoing is directed to embodiments of the present disclosure, other and further embodiments of the disclosed subject matter may be devised without departing from the basic scope thereof, and the scope thereof is determined by the claims that follow.

The invention claimed is:

1. An apparatus, comprising:
a chamber defining a process volume therein and comprising at least one quartz element;
a substrate support disposed within the process volume;
a viewport window comprising a first longitudinal axis; and
a sensor view pipe having a second longitudinal axis extending between the quartz element and the viewport window, the first longitudinal axis and second longitudinal axis forming an angle between about 91° and 100°.

2. The apparatus of claim 1, wherein the chamber has one or more openings.

3. The apparatus of claim 2, wherein a first end of the sensor view pipe is coupled to the opening and a second end of the sensor view pipe is coupled to a flange.

4. The apparatus of claim 3, wherein the flange has a top surface positioned at an angle between about 91° and 100° with respect to an upper surface of the substrate support.

5. The apparatus of claim 3, further comprising:
a viewport window disposed on the flange.

6. The apparatus of claim 1, further comprising:
a purge gas tube coupled to the sensor view pipe, wherein the purge gas tube is in fluid communication with an inert gas source.

7. The apparatus of claim 1, wherein the sensor view pipe is comprised of an upper section and a lower section, the upper section having a first inner diameter and the lower section having a second inner diameter larger than the first inner diameter.

8. The apparatus of claim 7, wherein the upper section and the lower section are two individual components welded together.

9. The apparatus of claim 1, wherein:
the quartz element comprises at least one of:
an upper dome; and
a lower dome opposing the upper dome, and wherein the sensor view pipe extends between and optical sensor and the upper dome; and
the chamber further comprises:
a sidewall disposed between the upper dome and the lower dome;
wherein the viewport window disposed over the sensor view pipe; and
a radiation source disposed below the lower dome.

10. The apparatus of claim 9, wherein the upper dome has one or more openings, and a first end of the sensor view pipe is coupled to the opening and a second end of the sensor view pipe is coupled to a flange.

11. The apparatus of claim 10, wherein a longitudinal axis of the flange is at an angle of about 91° to about 100° with respect to a longitudinal axis of the sensor view pipe.

12. The apparatus of claim 10, wherein the sensor view pipe is comprised of an upper section and a lower section, the upper section having a first inner diameter and the lower section having a second inner diameter larger than the first inner diameter.

13. The apparatus of claim 9, further comprising:
a purge gas tube coupled to the sensor view pipe, wherein the purge gas tube is in fluid communication with an inert gas source.

14. The apparatus of claim 9, further comprising:
a reflector plate disposed over the upper dome, the reflector plate having a plurality of perforations; and
a cover plate disposed over the reflector plate, wherein the sensor view pipe is extended upwardly through the perforation of the reflector plate and over the cover plate.

15. The apparatus of claim 14, wherein the reflector plate is a split design that can be separated into two halves along a split line.

* * * * *